(12) United States Patent
Tadeparthy

(10) Patent No.: US 7,375,586 B2
(45) Date of Patent: May 20, 2008

(54) LOW VOLTAGE STRUCTURE FOR GAIN BOOSTING IN HIGH GAIN AMPLIFIERS

(75) Inventor: Preetam Charan Anand Tadeparthy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 138 days.

(21) Appl. No.: 11/164,957

(22) Filed: Dec. 12, 2005

(65) Prior Publication Data
US 2006/0197598 A1  Sep. 7, 2006

Related U.S. Application Data

(60) Provisional application No. 60/635,648, filed on Dec. 13, 2004.

(51) Int. Cl.
*H03F 3/45* (2006.01)

(52) U.S. Cl. .................................................. 330/260
(58) Field of Classification Search ................. 330/260, 330/257
See application file for complete search history.

(56) References Cited

U.S. PATENT DOCUMENTS 6,114,907 A * 9/2000 Sakurai ..................... 330/253
6,825,721 B2 * 11/2004 Sanchez et al. ............ 330/253

* cited by examiner

*Primary Examiner*—Steven J. Mottola
(74) *Attorney, Agent, or Firm*—William B. Kempler; W. James Brady, III; Frederick J. Telecky, Jr.

(57) ABSTRACT

Reducing the bias voltage level required in a boost amplifier enhancing a gain of amplifier comprising first and second amplification stages. In an embodiment, the booster amplifier circuit contains a first transistor receiving both the bias voltage and the input signal respectively on the gate and source terminal and the drain terminal is coupled to second amplification stage of the high gain amplifier.

5 Claims, 5 Drawing Sheets

LOW VOLTAGE STRUCTURE FOR GAIN BOOSTING IN HIGH GAIN AMPLIFIERS

RELATED APPLICATIONS

The present application is related to the co-pending U.S. Provisional Patent Application Ser. No. 60/635,648, entitled, "Novel Amplifier Sharing Scheme for Pipeline Analog to Digital Converter", filed on Dec. 13, 2004, attorney docket number: TI-38637PS, naming as inventor: TADEPARTHY et al and is incorporated in its entirety herewith.

FIELD OF THE INVENTION

The present invention relates generally to the design of integrated circuits and more specifically to method and apparatus for providing a low voltage structure for gain boosting in high gain amplifiers.

RELATED ART

High gain amplifiers are often used in various environments to amplify an input signal to generate an amplified output signal. An analog to digital converter (ADC) represents an example component in which high gain amplifiers are employed to amplify an input signal sought to be converted to corresponding digital codes.

Various techniques/approaches are employed to implement an amplifier providing a high gain. In one prior approach, cascading (common emitter/source followed by common base/gate) structure of multiple stages of transistors are used to achieve a high gain. However such a structure requires a high voltage supply for reliable operation, thereby rendering the corresponding solutions unsuitable for use in low voltage applications.

Gain boost techniques are often employed associated with amplifiers to further enhance the gain of cascode amplifier without consuming substantially more power. Gain boosting generally refers to a technique wherein the DC Gain of the amplifier is increased to a desired value without affecting the UGB (unity gain bandwidth) of the amplifier.

It is often desirable that the gain boost circuits operate at low voltages, which can lead to advantages such as facilitating the gain amplifier also to operate at low supply voltage, thereby potentially reducing the power consumption requirements and size.

BRIEF DESCRIPTION OF THE DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit (s) in the corresponding reference number.

DETAILED DESCRIPTION

1. Overview

A differential amplifier (designed to amplify the difference of a first signal and a second signal) provided according to an aspect of the present invention contains a first transistor receiving the first signal on a gate terminal and the second signal on a source terminal. The drain terminal of the transistor is connected to an active load (e.g., one of said pair of output terminal) generating the differential output.

The differential amplifier thus provided is used as a boost amplifier associated with a cascode amplifier designed to provide high gain amplification. Due to such an architecture, the high gain amplifiers can be implemented with a low supply voltage.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Component

Figure 1:
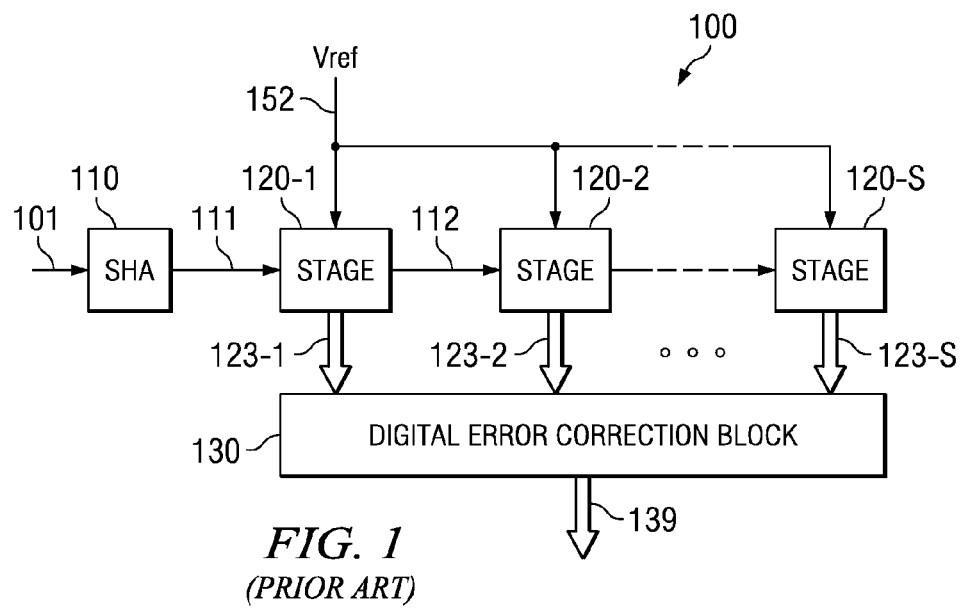
FIG. 1 is a block diagram illustrating the internal structure of example ADC in which several aspects of the present invention are implemented.

FIG. 1 is a block diagram of a pipe line ADC illustrating an example component in which various aspect of present invention may be implemented. ADC 100 is shown containing sample and hold amplifier (SHA) 110, stages 120-1 through 120-S and digital error correction block 130. Each block is described below in further detail.

SHA 110 samples the input analog signal received on path 101 and holds the voltage level of the sample on path 111 for further processing. Digital error correction block 130 receives sub-codes from various stages 120-1 through 120-S (on paths 123-1 through 123-S respectively), and generates a digital code corresponding to the sample received on path 101. Various error correction approaches, well known in the relevant arts, may be used to correct any errors in the received sub-codes. The generated digital code is provided on path 139 as a final digital code corresponding to the voltage of a sample on the input analog signal at a particular time instant.

Figure 2:
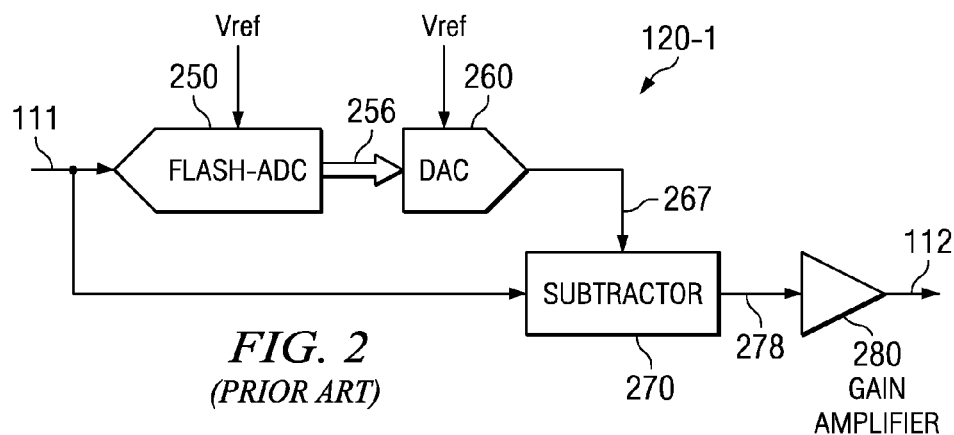
FIG. 2 is a block diagram illustrating the general operation of a stage of an ADC in one embodiment.

Each stage 120-1 through 120-S generates a sub-code (based on the reference signal Vref received on path 152) corresponding to a voltage level of an analog signal received as an input, and an amplified residue signal as an input to a (any) next stage. For example, stage 120-1 converts a voltage level on path 111 to generate a sub-code on path 123-1, and the amplified residue signal generated on path 112 is provided as an input to stage 120-2. A common reference signal Vref is generally provided to stages 120-1 through 120-S. FIG. 2 further illustrates (logical) components contained in each stage (described with reference to stage 120-1 only, for conciseness) of a pipe line ADC according to a known approach.

3. Stage of an ADC

With respect to FIG. 2, stage 120-1 is shown containing flash ADC 250, digital to analog converter (DAC) 260, subtractor 270 and gain amplifier 280. Flash ADC 250 (an example of a sub ADC) converts a sample of an analog signal received on path 111 into a corresponding p-bit sub-code provided on path 256 (contained in path 123-1 of FIG. 1, and P is less than N). DAC 260 generates the voltage equivalent of the sub-code received on path 256. The generated voltage (Vdac) is provided on path 267.

Subtractor 270 generates a residue signal as the difference of sample 111 (Vi) and the analog signal received on path 267. Gain amplifier 280 amplifies the residue signal (Vi-Vdac) and the amplified signal is provided on path 112 as an amplified residue signal. The signal on path 112 is used to resolve the remaining bits in the N-bit digital code by the subsequent stages of the ADC.

The manner in which gain amplifier 280, DAC 260 and subtractor 270 are implemented together is described below with respect to FIGS. 3. Shown there are switches 310A-310C, a unit sampling capacitor 330, op-amp 350, feedback capacitor 360, and feedback switch 380. It should be appreciated that only a single unit sampling capacitor and corresponding switches are shown in FIG. 3 for conciseness. However the circuit would contain $2^{\wedge\wedge}p$ such sets, wherein >^^=represents the >power of=mathematical operation.

Figure 3A:
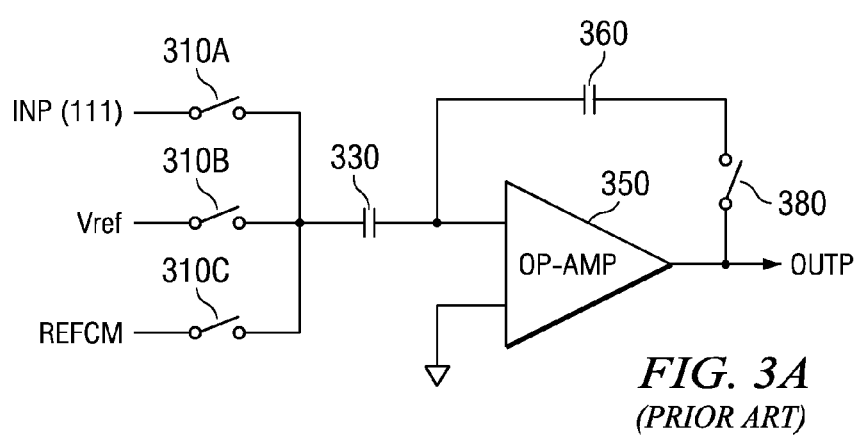
FIG. 3A is a circuit diagram of the implementation of a DAC, residue amplifier and a subtractor of a stage according to a prior approach.
Figure 3B:
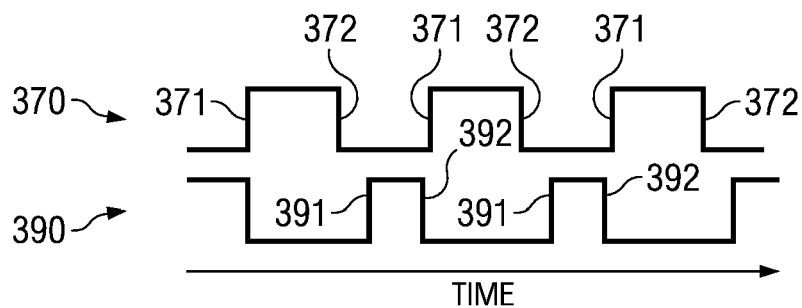
FIG. 3B is a timing diagram illustrating the sampling and hold phases of a stage of an ADC in one embodiment.

The circuit of FIG. 3A operates using two phase signals, shown as sampling phase 370 and hold phase 390 in FIG. 3B. In the first phase (sampling phase 370) between time points 371 and 372, switch 310A is closed at time points 371 and the remaining switches 380, 310B, and 310C are kept open. As a result, sampling (input) capacitor 330 is ideally charged (in duration between 371-372) to the voltage of input sample received on path (INP) 111.

In the second phase (between time points 391-392), feedback switch 380 is closed and switch 310A is kept open. Connections of switches 310B and 310C are made such that the input terminals of sampling capacitor 330 is connected either to Vref or to REFCM terminal, as determined from the output of flash ADC 250 (sub-code S). As a result, capacitor 330 transfers a charge proportional to the difference (residue) of input signal and the Vref or REFCM to feedback capacitor 360 (up to time point 392). The residue is amplified by op-amp 350 and provided as amplified residue signal to the next stage (on path OUTP), as desired.

It may be appreciated that op-amp 350 is used for amplifying the residue signal only between time points 391 and 392 (corresponding to hold/amplifying phase of stage 120-1). The gain of op-amp 350 needs to generally equal $2^{\wedge\wedge}P$, wherein '^^' represents the 'power of operation' and P represents the number of bits resolved by the stage. It should be appreciated that P would be high in high resolution ADCs, thereby requiring the gain of the op-amp to be high.

In general, it is desirable to implement op-amp 350 using low supply voltage even for high gains. Various aspects of the present invention enable op-amp 350 to be implemented while meeting such a requirement. However, it is helpful to understand the general operation of a op-amp and the implementation in a prior embodiment.

4. Prior Operational Amplifier

Figure 4:
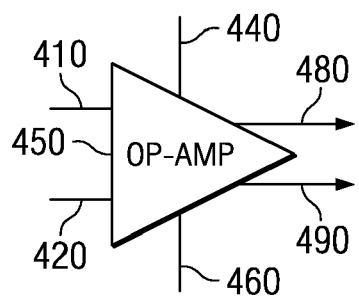
FIG. 4 is a block diagram illustrating the general operation of an op-amp.

FIG. 4 is a block diagram illustrating the general operation of an op-amp. Op-amp 450 there is shown receiving differential inputs on terminals 410 and 420, and providing differential outputs on terminals 480 and 490. The required bias voltages are internally derived (by using current sources) from a power source (Vdd/Vss) on terminals 440 and 460. In general, the magnitude of the voltage levels (Vdd) supplied by the power source needs to be low.

Figure 5:
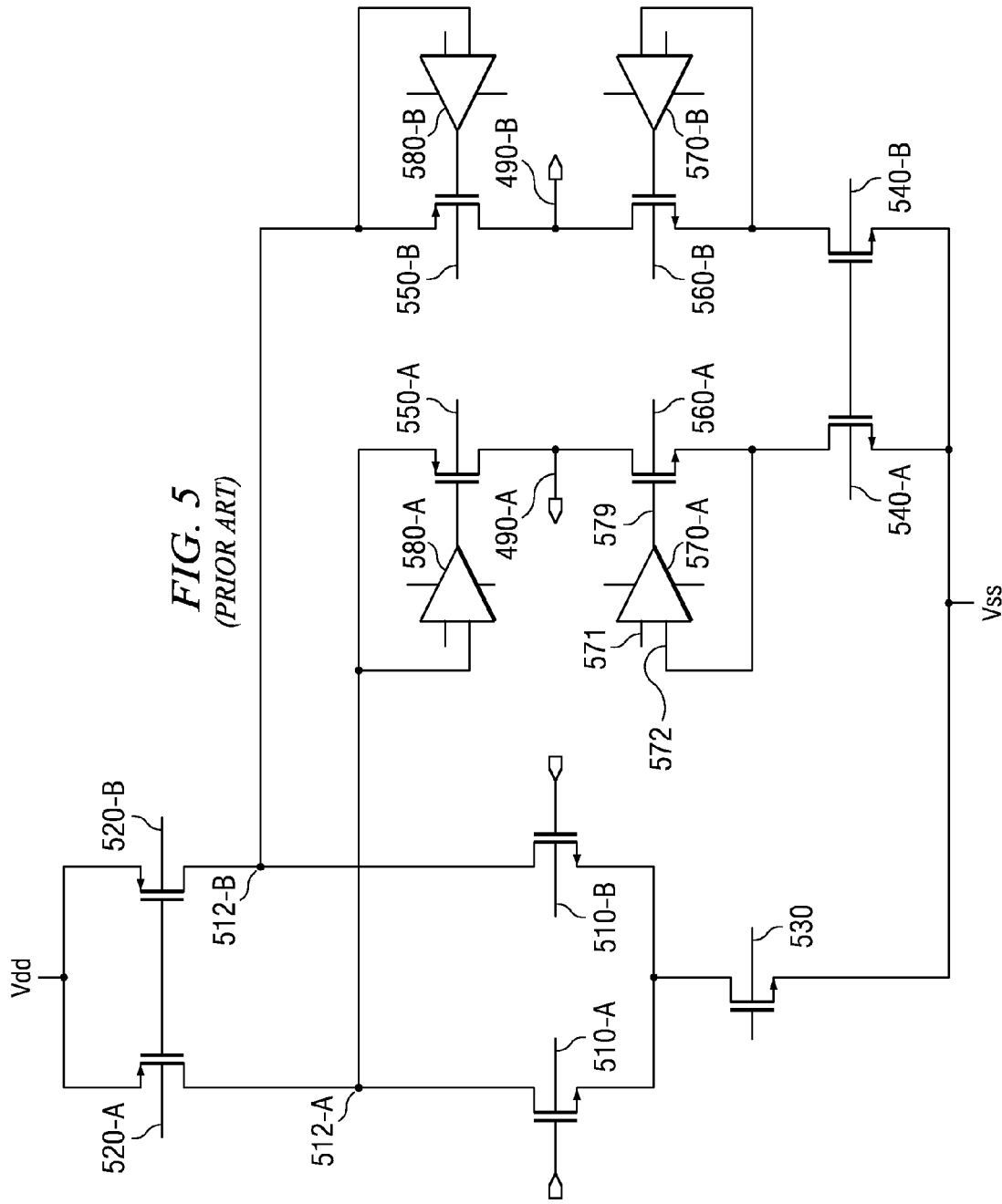
FIG. 5 is a circuit diagram illustrating the details of an op-amp in one prior embodiment.

FIG. 5 is a circuit diagram illustrating the details of op-amp 450 in one prior embodiment. As may be readily appreciated, the circuit is implemented in the form of a folded cascode amplifier with gain boosting. In particular, transistors 510A and 510B receive the differential input signal on the respective gate terminals, and provide the amplified (first amplification stage) differential output (in common source configuration) on the drain terminals at nodes 512A and 512B.

Transistors 520A and 520B operate as a current mirror sourcing constant current, and transistor 530 operates as a resistor (providing a bias). Transistor 560A, 560B, 550A and 550B together operate as a cascode amplifier (common gate configuration) and provide the amplified (second amplification stage) differential output signal on path 490A and 490B.

Amplifiers 570A, 570B, 580A and 580B (booster amplifier circuit) operate as a gain booster structure (well known in the field of art). Amplifiers 570A, 570B, 580A and 580B respectively increases the overall DC gain of the amplifier formed by transistors 510A, 510B, 550A, 550B, 560A and 560B. Amplifier 570A is shown receiving a bias voltage on terminal 571 and positive output voltage on terminal 572, and generating an output voltage on terminal 579. The gain booster structure/amplifier 570A may require a high supply voltage to provide the desired biasing (to provide desired DC gain boost) at the source terminal of transistor 560A (e.g. common mode signal). The need for such high supply voltage to provide a desired gain boost in one prior embodiment, is described below with respect to FIG. 6.

5. Prior Gain Booster Amplifier

Figure 6:
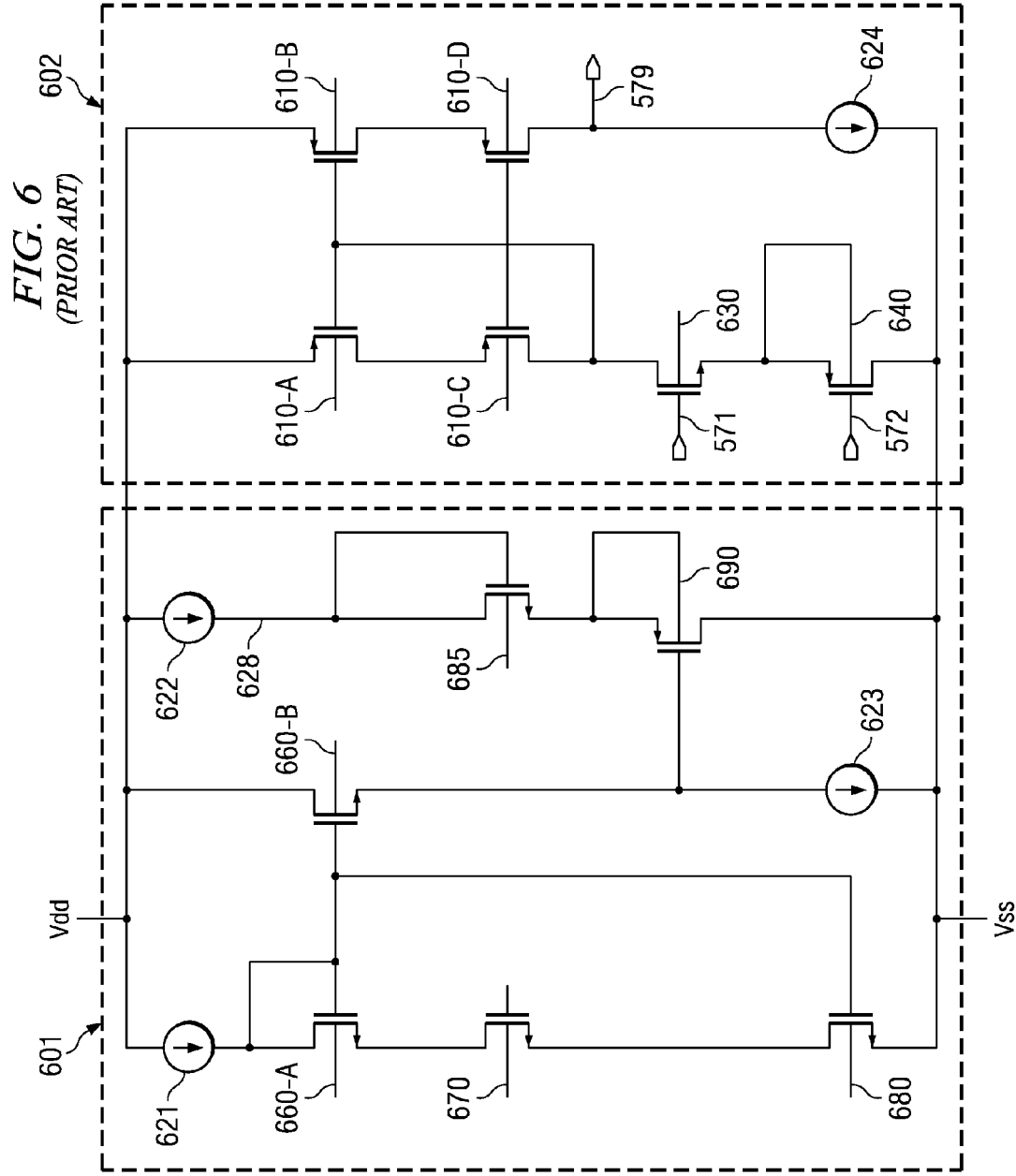
FIG. 6 is a circuit diagram illustrating the details of an amplifier in a gain booster circuit in one prior embodiment.

FIG. 6 is a circuit diagram illustrating the details of a gain boost amplifier (e.g., 570A in one prior embodiment. The circuit is shown containing bias portion 601 and amplification portion 602. Each portion is described and analyzed in further detail below.

Amplification portion 602 is shown containing transistors 610A and 610B operating as a current mirror. Transistors 610C and 610D together operate to as active load resistors to enhance the gain of the boost amplifier. Transistors 630 and 640 operate as a complementary input pair of transistors. Current source 624 operates as a constant current sink.

The signals 571 and 572 are respectively received on gate terminals of transistors 630 and 640. The differential signal is amplified and converted to single ended output by transistors 610A and 610B. The amplified output is provided on terminal 579.

Bias portion 601 generates a bias voltage to be provided on terminal 571. Bias portion 601 receives supply voltage Vdd and generates a desired bias voltage at node 628. Transistors 660A and 660B operate as level shifters by shifting the voltage at source of 660-A to source of 660-B and transistors 670 and 680 operate as resistors to provide a desired bias to amplification portion 602. Transistors 680 and 670 operate in linear region and respectively drops a VDS equaling VDsat of 540 A/B and a additional voltage needed for margin). Transistors 685 and 690 operate as a voltage (shifter) and provide a biasing voltage at node 628 such that (when the loop around the cascade is closed) the DC voltage dropped across the complimentary input pairs is cancelled and voltage at the source of 660-A appears at the source of 560-A .

The description is continued to demonstrate that a high bias voltage would be required to generate a desired voltage at output 579 so that the appropriate voltage appears at the source of 560-A and thereby to enhance overall gain of cascode amplifier (e.g FIG. 5)

Continuing with combined reference to FIGS. 5 and 6, the minimum bias voltage on gate terminal of transistor 560A needs to be greater than the sum of threshold (VTN) and overdrive (VON) voltages of transistor 560-A and VDsat of 540-A. In addition a margin is added to the computed bias voltage for reliable operations. Hence, with respect to FIG. 6, bias voltage (Vgbias) on gate terminal of transistor 630 needs to be equal to or greater than (>=):

$$Vgbias(630) >= VTN(630) + VTP(640) + VON(630) + VON(640) + VON(540) + Vmargin(540A) \quad \text{Equation (1)}$$

wherein Vmargin represents the additional bias voltage for stability in bias for the corresponding transistor.

Simplifying Equation (1), we obtain:

$$VGbias(630) > VTP + VTN + 3VON + Vmargin \quad \text{Equation (2)}$$

In addition to the voltage needed atterminal (gate of transistor 630) 571 according to equation 2, voltage required to provide the bias for transistor implemented as current source 622. Assuming the current source is implemented as a single transistor current mirror. The minimum head room contain would be $$AVDD > Vgbias(630) + VON(622) + Vmargin(622) \quad \text{Equation (3)}$$

From equation 2 and 3, $$AVDD > VTP + VTN + 4VON + 2Vmargin \quad \text{Equation (4)}$$

For illustration assuming VTP=500 mv, VTN=800 mv, VON=200 mv and Vmargin=100 mv, the minimum bias on terminal 571 needs to be equal to or greater than 2.3V. As a result the power supply to the boost amplifier generating such bias voltage needs to be greater than the 2.3 volts. Hence a the circuit of FIG. 6 may not provide desired overall gain at low power supply voltage. Various aspects of the present invention enable the bias voltage at terminal 571 to be reduced, as described below in further detail.

Novel Gain Booster Amplifier

Figure 7:
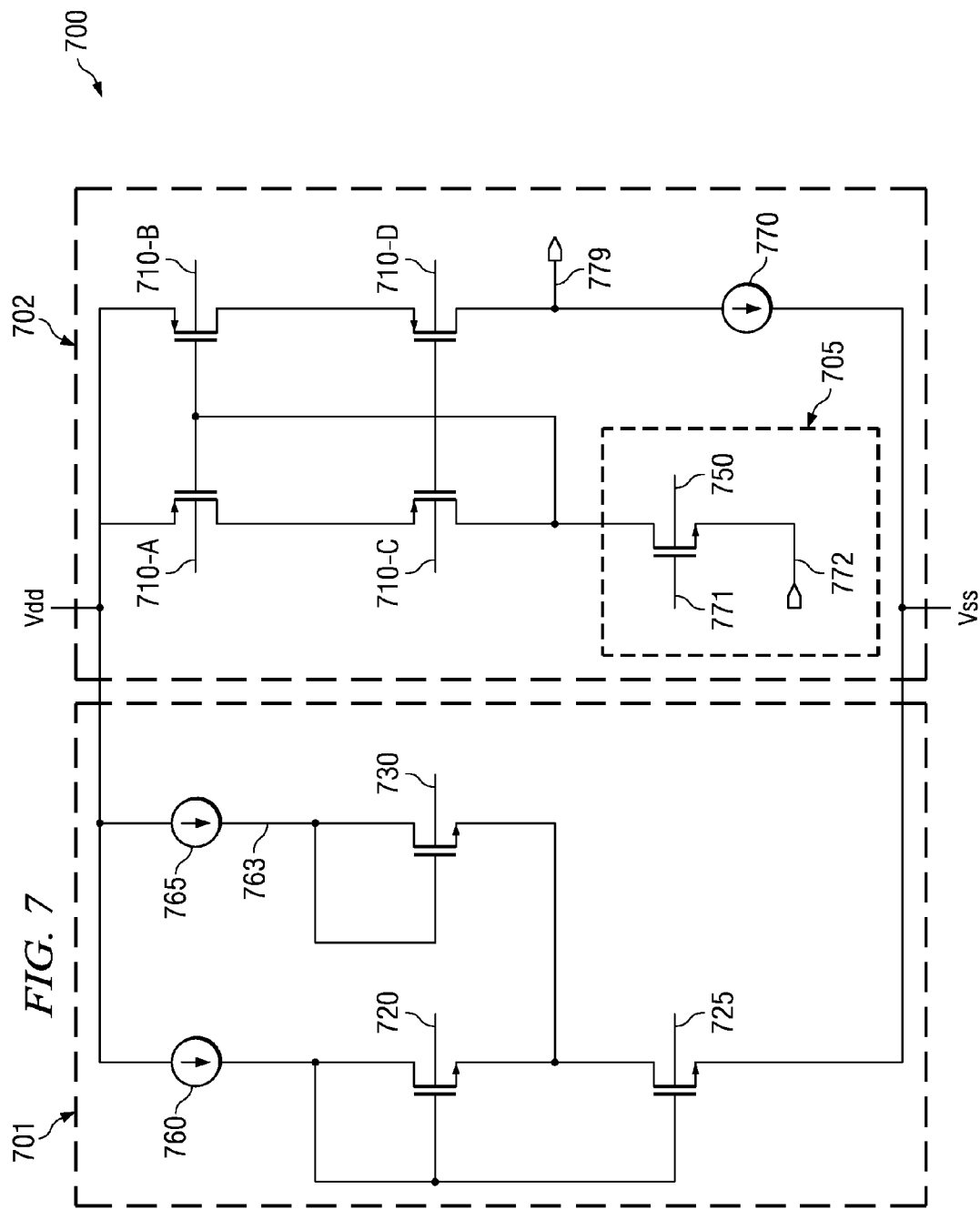
FIG. 7 is a circuit diagram illustrating the structure of a gain boost amplifier in an embodiment of the present invention.

FIG. 7 is a circuit diagram illustrating the structure of a gain boost amplifier in an embodiment of the present invention. The gain boost amplifier 700 may be used in the place of amplifiers 570A, 570B, 580A and 580B. The gain boost amplifier is shown containing biasing portion 701 and amplification portion 702. Each portion is described below in further detail.

With respect to amplification portion 702, transistors 710A, 710B, 710C and 710D operate like transistors 610A, 610B, 610C and 610D in FIG. 6. Transistors 750 operates as a common gate amplifier (705). The common gate amplifier 705 receives signal 771 and 772 (similar to signal 571 and 572) respectively on gate terminal and source terminal of transistor 750.

Accordingly, the difference signal (between gate and source of transistor 750) is and converted to single ended output (using transistor 710A, 710B, 710C and 710D. Transistors 710B, 710D and current mirror 770 provides a desired amplification and the amplified output is provided on terminal 779 (similar to terminal 579.

Common gate amplifier 705 is shown receiving input signal 772 on source terminal and gate terminal is shown receiving bias voltage 771. Since both bias voltage 771 (e.g 571) and signal 772 (e.g of 572) is received on two terminals of a single transistor, minimum bias voltage required to be maintained on terminal 771 is reduced, and is given as:

$$Vbias => VTN(750) + VON(750) + VON(540-A) + Vmargin(540-A) \quad \text{Equation (5)}$$

$$AVDD => Vbias + VON(765) + Vmargin(765) \quad \text{Equation (6)}$$

From equation 5 and 6

$$AVDD => VTN + 3VON + Vmargin \quad \text{Equation (7)}$$

Assuming the same values used with respect to Equation (2) noted above, the minimum Vbias required on terminal 771 of FIG. 7 equals 1.2V. Due to the requirement of low bias voltage the boost amplifier of FIG. 7 may operate as desired even when the supply voltage is low (as against 2.3 volts in prior embodiment of FIG. 6)As a result the gain amplifier may operate reliably even at substantially low power supply (Vdd).

Bias circuit 701 formed by transistors 720, 725, and 730 and current sources 760 and 765 provides the desired bias to terminal 771 even when the supply voltage is much lesser 2.3 V.

Even though the description is provided for one gain booster amplifier, it should be appreciated that the remaining gain boost amplifiers may also be implemented using similar approaches, as will be apparent to one skilled in the relevant arts by reading the disclosure provided herein. Similarly, though the description is provided with respect to various connections above, it may be further appreciated that the elements may be coupled (with other intermediate elements in between) with any desirable components in between, as suited for the specific situations.

The embodiment(s) of above can be implemented in various devices/systems. The description is continued with respect to an example device in which various aspects of the present invention are implemented.

8. Device

Figure 8:
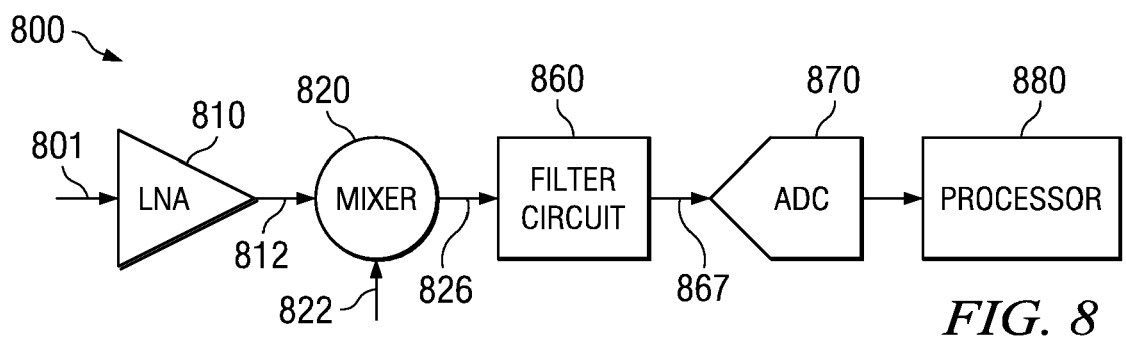
FIG. 8 is a block diagram illustrating the details of implementation of a device in an embodiment of the present invention.

FIG. 8 is a block diagram of receiver system 800 illustrating an example system in which various aspects of the present invention may be implemented. For illustration, it is assumed that receiver system 800 is implemented within a Wireless Receiver. However, receiver system 800 can be implemented in other devices (wireless as well as wire based communications) as well.

Receiver system 800 is shown containing low noise amplifiers (LNA) 810, mixer 820, filter circuit 860, analog to digital converter (ADC) 870, and processor 880. Each block/stage is described in further detail below.

LNA 810 receives signals on path 801 and amplifies the received signals to generate a corresponding amplified signal on path 812. For example, in wireless systems, the signals that are transmitted from satellites, etc. may be received by an antenna (not shown) and the received signals are provided on path 801. The received signals may be weak in strength and thus amplified by LNA 810 for further processing. LNA 810 may be implemented in a known way.

Mixer 820 may be used to down convert the received amplified signal on path 812 into an intermediate signal with the frequency band of interest centered at a lower frequency than the carrier frequency of the received signal. In an embodiment, a signal with the frequency band of interest centered at 2.4 GHZ (carrier frequency) is converted to a signal with the frequency band of interest centered at zero frequency.

Mixer 820 may receive the amplified signal on path 812 and a signal of fixed frequency on path 822 as inputs, and provides the intermediate signal on path 826. The signal of fixed frequency on path 822 may be generated by a phase locked loop (not shown) in a known way.

Filter circuit 860 may correspond to a low pass filter, which allows the desired low frequencies and rejects all other unwanted high frequencies present in the signal received on line 826. The filtered signal, which contains the frequency band of interest, is provided on path 867.

ADC 870 converts (samples) the filtered signal received on path 867 to a corresponding digital value, which represents the signal of interest in received signal 801. Processor 880 processes the received digital values to provide various user applications and may be implemented as multiple processing units, each potentially operating independently. ADC 870 may correspond to the ADCs described in sections above (and implemented according to various aspects of the present invention).

9. CONCLUSION

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A gain amplifier to amplify an input signal and generate a high gain output signal on an output terminal, said gain amplifier comprising:
    a first amplification stage receiving said input signal and generating an output;
    a second amplification stage receiving said output of said first amplification stage on an input terminal and generating an amplified output on said output terminal; and
    a booster amplifier circuit causing the gain of said second amplification stage to be enhanced and to cause said high gain output signal to be generated, said booster amplifier circuit comprising:
    a first transistor receiving a bias signal on a gate terminal, a source terminal of said first transistor being coupled to said output terminal and said output of said first amplification stage, a drain terminal of said first transistor being coupled to said second amplification stage;
    a load connected to said drain terminal of said first transistor and a current source providing bias current to said first transistor.

2. The gain amplifier of claim 1, wherein said first amplification stage comprises a second transistor and said input signal is received on a gate terminal of said second transistor and said output of said first amplification stage is provided on a drain terminal of said second transistor.

3. The gain amplifier of claim 2, wherein said second amplification stage comprises a third transistor and said input terminal of said second amplification stage representing a source terminal of said third transistor and a drain terminal of said third transistor is coupled to said output terminal of said gain amplifier.

4. The gain amplifier of claim 3, wherein said load comprises a fourth transistor and a fifth transistor wherein the gate terminals of said fourth transistor and said fifth transistor are coupled to each other, and the drain terminal of one of said fourth and fifth transistor is coupled to said drain terminal of said third transistor and the drain terminal of the other one of said fourth or fifth transistor is coupled to said output terminal, and the source terminals of said third transistor and said fourth transistor are coupled to a supply voltage.

5. The gain amplifier of claim 1, wherein said input signal comprises one of a pair of inputs in the form of a differential signal and said high gain output signal is also generated in the form of a differential signal.

* * * * *